(12) United States Patent
Roh

(10) Patent No.: US 7,316,973 B2
(45) Date of Patent: Jan. 8, 2008

(54) METHOD FOR FABRICATING SEMICONDUCTOR DEVICE

(75) Inventor: Jai-Sun Roh, Ichon-shi (KR)

(73) Assignee: Hynix Semiconductor, Inc., Kyoungki-Do (KR)

( * ) Notice: Subject to any disclaimer, the term of this patent is extended or adjusted under 35 U.S.C. 154(b) by 342 days.

(21) Appl. No.: 11/002,706

(22) Filed: Dec. 3, 2004

(65) Prior Publication Data

US 2006/0003582 A1 Jan. 5, 2006

(30) Foreign Application Priority Data

Jun. 30, 2004 (KR) .................. 10-2004-0050189

(51) Int. Cl.
*H01L 21/00* (2006.01)

(52) U.S. Cl. .................. 438/675; 438/396; 438/763

(58) Field of Classification Search ............ 438/675, 438/763, 396
See application file for complete search history.

(56) References Cited

U.S. PATENT DOCUMENTS

| | | | |
|---|---|---|---|
| 6,423,610 B1* | 7/2002 | Roh | 438/396 |
| 6,706,635 B2* | 3/2004 | Khan et al. | 438/692 |
| 6,893,983 B2* | 5/2005 | Sun et al. | 438/784 |
| 6,979,615 B2* | 12/2005 | Khan et al. | 438/257 |
| 2002/0039827 A1* | 4/2002 | Roh | 438/396 |
| 2003/0228764 A1* | 12/2003 | Khan et al. | 438/692 |
| 2004/0053455 A1* | 3/2004 | Khan et al. | 438/197 |
| 2004/0119145 A1* | 6/2004 | Sun et al. | 257/632 |
| 2004/0150096 A1* | 8/2004 | Purushothaman et al. | 257/701 |
| 2005/0221595 A1* | 10/2005 | Khan et al. | 438/593 |
| 2006/0003582 A1* | 1/2006 | Roh | 438/675 |
| 2006/0231898 A1* | 10/2006 | Jeong et al. | 257/359 |
| 2007/0057302 A1* | 3/2007 | Ho et al. | 257/301 |

* cited by examiner

Primary Examiner—Laura M. Schillinger
(74) Attorney, Agent, or Firm—McDermott Will & Emery LLP

(57) ABSTRACT

The present invention relates to a method for fabricating a semiconductor device capable of preventing bridge formation caused by damages to a capacitor oxide structure including a phosphosilicate glass (PSG) layer and a tetraethylorthosilicate (TEOS) layer during a wet cleaning process. The method includes the steps of: forming a PSG layer on a substrate; forming a capping layer on the PSG layer; forming a TEOS layer on the capping layer; selectively etching the TEOS layer, the capping layer and the PSG layer to form a plurality of openings exposing predetermined portions of the substrate; cleaning the openings; forming a conductive layer on the openings; and removing the conductive layer until the TEOS layer is exposed, so that the conductive layer is isolated for each opening.

14 Claims, 15 Drawing Sheets

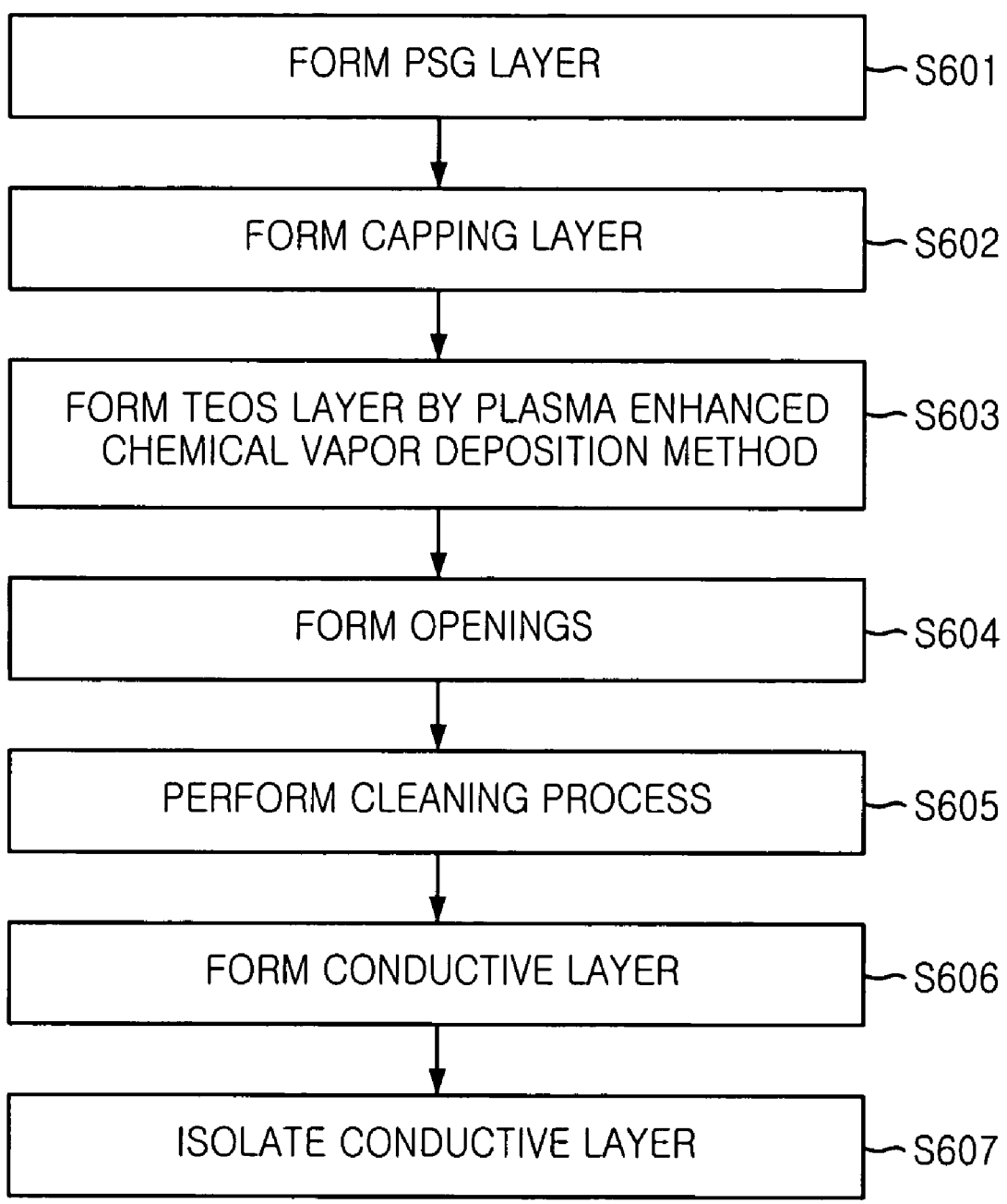

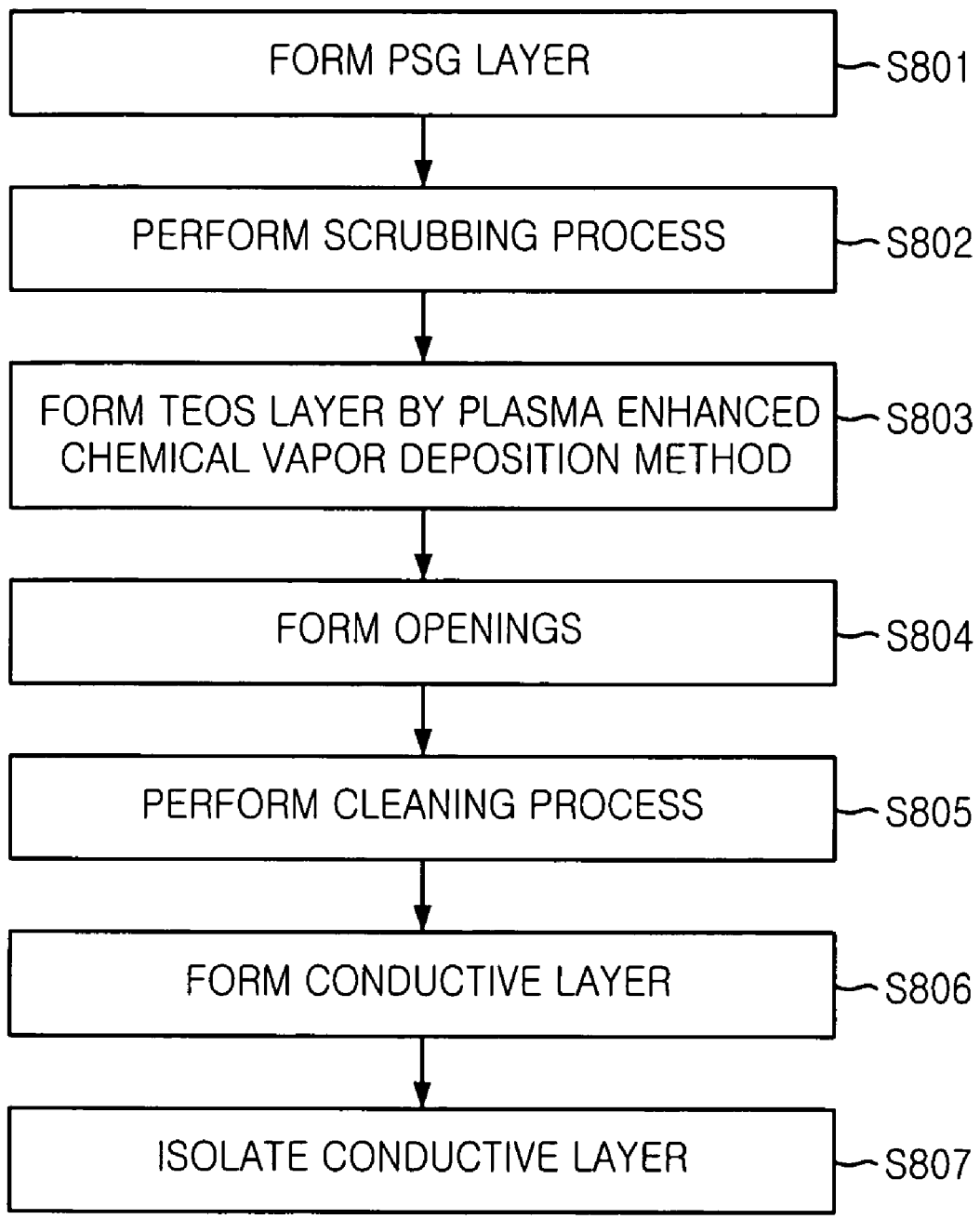

METHOD FOR FABRICATING SEMICONDUCTOR DEVICE

FIELD OF THE INVENTION

The present invention relates to a method for fabricating a semiconductor device; and more particularly, to a method for fabricating a semiconductor device capable of preventing generation of bridges between conductive structures caused by damaged insulation layer during a wet cleaning process.

DESCRIPTION OF RELATED ARTS

As the scale of integration of a semiconductor device has been advanced, there have been various attempts to secure a sufficient capacitance as much as the decreased pitch between device elements. One of the attempts is to increase a height of a capacitor and form the capacitor in a cylinder or concave type.

FIG. 1 is a cross-sectional view of a semiconductor device in which storage nodes are formed.

As shown, an insulation layer 101 is formed on a substrate provided with transistors, wells and bit lines. Although not illustrated, conductive regions are formed on predetermined portions of the substrate 100. There are contact plugs 102 electrically connected with the conductive regions by passing through the insulation layer 101. Herein, the above mentioned conductive regions are cell contact plugs, and the insulation layer 101 is made of at least one oxide-based material. The contact plugs 102 are storage node contact plugs.

Subsequently, an etch stop layer 103 for protecting the contact plugs 102 from an etching process applied to a capacitor oxide layer is formed on the contact plugs 102 and the insulation layer 101. A phosphosilicate glass (PSG) layer 104 is formed on the etch stop layer 103. Then, a plasma enhanced chemical vapor deposition (PECVD) method is performed to deposit a tetraethylorthosilicate (TEOS) layer 105 on the PSG layer 104. The TEOS layer 105, the PSG layer 104 and the etch stop layer 103 are etched to form a plurality of openings 106 exposing the respective contact plugs 102. In a capacitor-over-bit line (COB structure), a storage node 107 which is a lower electrode of a capacitor is formed on each of the openings 106. Then, the storage nodes 107 are planarized by a predetermined planarization process, so that the storage nodes 107 are isolated from each other.

Also, the TEOS layer 105 and the PSG layer 104 are formed as the capacitor oxide structure that determine the height of the capacitor which is mandated to increase in order to secure an intended level of capacitance.

Typically, the TEOS layer is solely used as the capacitor oxide layer. However, as the TEOS layer is thickly deposited with a thickness of 20,000 Å for the purpose of increasing the capacitance, an aspect ratio increases in the etching process for forming the openings that exposes the storage node contact plugs, and as a result, it is difficult to obtain a desired critical dimension (CD) at a bottom portion of the opening.

Also, the PSG layer has a higher etch rate than the TEOS layer during a dry etching process and a wet etching process because of phosphorus contained in the PSG layer. Thus, it is much easier to secure the bottom CD of the opening. For these reasons, a stack structure of the TEOS layer and the PSG layer is preferably adopted for the capacitor oxide structure.

Prior to forming a conductive layer for use in a storage node, a wet cleaning process is employed to remove etch remnants and an interfacial oxide layer formed at each bottom of the openings 106. At this time, a cleaning solution of hydrogen fluoride (HF) or buffered oxide etchant (BOE) is used for the wet cleaning process. However, during the wet cleaning process, the capacitor oxide structure, i.e., the TEOS layer 105 and the PSG layer 104, is damaged, resulting in creation of a tunnel in the capacitor oxide structure. When the conductive layer for use in the storage node having a good step coverage characteristic is formed, the tunnel is also filled with the conductive layer, thereby forming bridges between the storage nodes 107.

In more detail, the bridge formation occurs because of the characteristic of the PSG layer 104 which contains a high concentration of diffusing phosphorus. That is, since the PSG layer 104 contains a higher concentration of phosphorus than the TEOS layer 105, the phosphorus diffuses from the PSG layer 104 to the TEOS layer 105. Because of the phosphorus diffusion, the density of the PSG layer 104 decreases, so that the PSG layer 104 is susceptible to the cleaning solution employed in the wet cleaning process. As a result, the PSG layer 104 is more easily damaged during the wet cleaning process, thereby creating the tunnel.

Also, since the concentration of phosphorus is higher in the PSG layer 104, the phosphorus diffusion extends to upper layers disposed above the PSG layer 104. This upwardly diffused phosphorus reacts with moisture of the atmosphere, thereby causing a characteristic of an interface between the PSG layer 104 and the TEOS layer 105 to be degraded. Thus, during the wet cleaning process, the interface between the PSG layer 104 and the TEOS layer 105 is damaged as the cleaning solution flows through the interface, thereby creating the tunnel. The diffusion of phosphorus occurs not only at the interface between the PSG layer 104 and the TEOS layer 105 but also at the PSG layer 104.

FIG. 2 is a micrograph showing the above described bridge formation between storage nodes. A reference denotation 'X' denotes the bridge formation between the storage nodes, and this bridge induces a device failure.

FIG. 3 is a diagram showing a bitmap of a wafer indicating pass/fail determination results for a wafer test. As described in FIG. 2, the device failure caused by the bridge shown in FIG. 2 is expressed as a reference denotation 'Y'.

FIG. 4 is a diagram briefly showing a conventional injector used for depositing a PSG layer.

As shown, a wafer is placed on a mount unit 50, and a source gas for depositing the PSG layer is injected through an injection pipe 51 and reacts with a reaction gas to form the PSG layer. Then, non-reacted gas molecules are exhausted as denoted with a reference numeral 52. Particularly, the deposition of the PSG layer proceeds at a device having four injectors, and the PSG layer is deposited in serial steps by passing through the four injectors. As a reference, the procedure of passing through all of the four injectors is called a pass, and a plurality of passes are employed to deposit the single PSG layer.

Meanwhile, if the deposition characteristic for each injector is different, there is generated a concentration difference between unit PSG layers each formed by passing through each of the injectors. Because of this concentration difference, phosphorus of the PSG layer may diffuse. However, this phosphorus diffusion can be minimal enough to be negligible.

FIGS. 5A to 5D are mimetic diagrams illustrating mechanisms of the bridge formation caused by the phosphorus diffusion. Herein, the same reference numerals described in FIG. 1 are used for the same device elements in this drawing.

Referring to FIG. 5A, a PSG layer 104 and a TEOS layer 105 are formed as a capacitor oxide structure. Herein, dotted lines within the PSG layer 104 are the aforementioned unit PSG layers deposited by passing through each injector shown in FIG. 4. Meanwhile, because of a difference in a phosphorus concentration between the PSG layer 104 and the TEOS layer 105, the phosphorus of the PSG layer 104 diffuses to the TEOS layer 105. A reference numeral 108 represents this phosphorus diffusion.

Referring to FIG. 5B, portions of the PSG layer 104 of which density is decreased by the phosphorus diffusion are susceptible to a cleaning solution of HF or BOE used in a wet cleaning process performed between the step of forming openings and the subsequent step of forming a conductive layer for forming storage nodes. That is, the portions of the PSG layer 104 are more likely damaged during the wet cleaning process.

Referring to FIG. 5C, a tunnel 109 is formed at an interface between the PSG layer 104 and the TEOS layer 105 because of the phosphorus diffusion extended to the portions of the PSG layer 104 of which density is decreased.

In addition to the interface, the tunnel 109 can be formed within the PSG layer 104. In case that the phosphorus diffusion is mainly occurs at the unit PSG layer of which phosphorus concentration is higher than the concentrations of the rest unit PSG layers, the decrease in the density of the unit PSG layer is severe at the interfaces each formed between the unit PSG layer having the high phosphorus concentration and each one of other neighbored unit PSG layers, thereby creating the tunnel 109 along theses interfaces.

Referring to FIG. 5D, the PSG layer 104 and the TEOS layer 105 are etched to form openings 106. Then, a conductive material for forming storage nodes 107 is deposited on the openings 106 and is then planarized to isolate the storage nodes 107 from each other. During the deposition of the conductive material, the conductive material penetrates the interface at which the tunnel 109 is formed, creating a bridge 111 between the storage nodes 107. A reference numeral 110 denotes the penetration of the conductive material.

There is another reason for the bridge formation. That is, the bridge formation occurs when adhesiveness between the PSG layer 104 and the TEOS layer 105 is poor. The poor adhesiveness between the PSG layer 104 and the TEOS layer 105 is caused by an interface characteristic of the PSG layer 104.

In more detail, when a number of semiconductor device fabrication processes are performed, there are frequent cases that a wafer awaits for a long time at specific processes. That is, during this delayed time, a surface of the PSG layer 104 becomes dry, and as a result, the PSG layer changes its property from hydrophilicity to hydrophobicity. The hydrophobicity of the PSG layer is exhibited generally after 5 hours from the deposition of the PSG layer. Therefore, when the TEOS layer 105 is formed on the hydrophobic PSG layer 104, adhesiveness between the TEOS layer 105 and the PSG layer 104 becomes poor, and thus, this interface is more susceptible to damages during the wet cleaning process.

Another cause of the poor adhesiveness is because the TEOS layer 105 and the PSG layer 104 are made of different types of materials even though these TEOS layer 105 and the PSG layer 104 are made of similar oxide-based materials. Because of this use of different types of materials, adhesiveness of the interface between the TEOS layer 105 and the PSG layer 104 becomes poor, resulting damages to the interface during the wet cleaning process.

Because of the phosphorus diffusion and poor adhesiveness, bridges are formed between the storage nodes, and this bridge may induce a device failure. Therefore, for increase in semiconductor device yields, it is necessary to develop a new technology capable of preventing damages to a capacitor oxide structure of a TEOS layer and a PSG layer during a wet cleaning process.

SUMMARY OF THE INVENTION

It is, therefore, an object of the present invention to provide a method for fabricating a semiconductor device capable of preventing bridge formation between isolated conductive layers caused by the fact that a stack oxide structure including a tetraethylorthosilicate (TEOS) layer and a phosphosilicate glass (PSG) layer is easily damaged during a wet cleaning process because of a poor interface characteristic between the TEOS layer and the PSG layer and a decreased density of the PSG layer as phosphorus contained in the PSG layer diffuses out.

In accordance with an aspect of the present invention, there is provided a method for fabricating a semiconductor device, including the steps of: forming a phosphosilicate glass (PSG) layer on a substrate; forming a capping layer on the PSG layer; forming a tetraethylorthosilicate (TEOS) layer on the capping layer; selectively etching the TEOS layer, the capping layer and the PSG layer to form a plurality of openings exposing predetermined portions of the substrate; cleaning the openings; forming a conductive layer on the openings; and removing the conductive layer until the TEOS layer is exposed, so that the conductive layer is isolated for each opening, wherein the capping layer is formed to prevent phosphorus from diffusing out from the PSG layer to the TEOS layer due to a difference in a phosphorus concentration gradient.

In accordance with another aspect of the present invention, there is provided a method for fabricating a semiconductor device, including the steps of: forming a PSG layer on a substrate; scrubbing a surface of the PSG layer to make the surface of the PSG layer exhibiting hydrophobicity when a process is delayed for a predetermined period hydrophilic; forming a TEOS layer on the scrubbed PSG layer; selectively etching the TEOS layer and the PSG layer to form a plurality of openings exposing predetermined regions of the substrate; cleaning the openings; forming a conductive layer on the openings; and removing the conductive layer until the TEOS layer is exposed, so that the conductive layer is isolated for each opening.

In accordance with still another aspect of the present invention, there is provided a method for fabricating a semiconductor device, including the steps of: forming a PSG layer on a substrate; applying a plasma treatment to the PSG layer; forming a TEOS layer on the plasma-treated PSG layer; selectively etching the TEOS layer and the PSG layer to form a plurality of openings exposing predetermined regions of the substrate; cleaning the openings; forming a conductive layer on the openings; and removing the conductive layer until the TEOS layer is exposed, so that the conductive layer is isolated for each opening, wherein the plasma treatment is employed to improve an interface characteristic between the TEOS layer and the PSG layer.

In accordance with still aspect of the present invention, there is provided a method for fabricating a semiconductor device, including the steps of: forming a plurality of isolated storage node contact plugs on a substrate provided with various device elements; forming a PSG layer on the storage node contact plugs; forming a capping layer on the PSG layer; forming a TEOS layer on the capping layer; selectively etching the TEOS layer, the capping layer and the PSG layer to form a plurality of openings exposing the storage node contact plugs; cleaning the openings; forming a conductive layer for use in a storage node on the openings; and removing the conductive layer until the TEOS layer is exposed, thereby obtaining a plurality of isolated storage nodes of capacitors, wherein the capping layer is formed to prevent phosphorus from diffusing out from the PSG layer to the TEOS layer due to a difference in a phosphorus concentration gradient.

In accordance with still another aspect of the present invention, there is provided a method for fabricating a semiconductor device, including the steps of: forming a plurality of isolated storage node contact plugs on a substrate provided with various device elements; forming a PSG layer on the storage node contact plugs; scrubbing a surface of the PSG layer to make the surface of the PSG layer exhibiting hydrophobicity when a process is delayed for a predetermined period hydrophilic; forming a TEOS layer on the scrubbed PSG layer; selectively etching the TEOS layer and the PSG layer to form a plurality of openings exposing the storage node contact plugs; cleaning the openings; forming a conductive layer for use in a storage node on the openings; and removing the conductive layer until the TEOS layer is exposed, thereby obtaining a plurality of isolated storage nodes of capacitors.

In accordance with further aspect of the present invention, there is provided a method for fabricating a semiconductor device, including the steps of: forming a plurality of isolated storage node contact plugs on a substrate provided with various device elements; forming a PSG layer on the storage node contact plugs; applying a plasma treatment to the PSG layer; forming a TEOS layer on the plasma-treated PSG layer; selectively etching the TEOS layer and the PSG layer to form a plurality of openings exposing the storage node contact plugs; cleaning the openings; forming a conductive layer for use in a storage node on the openings; and removing the conductive layer until the TEOS layer is exposed, thereby obtaining a plurality of isolated storage nodes of capacitors.

BRIEF DESCRIPTION OF THE DRAWINGS

The above and other objects and features of the present invention will become better understood with respect to the following description of the preferred embodiments given in conjunction with the accompanying drawings, in which:

FIG. 6 is a flowchart for showing sequential steps of a method for fabricating a semiconductor device in accordance with a first embodiment of the present invention;

FIG. 8 is a flowchart showing sequential steps of a method for fabricating a semiconductor device in accordance with a second embodiment of the present invention;

DETAILED DESCRIPTION OF THE INVENTION

Figure 1:
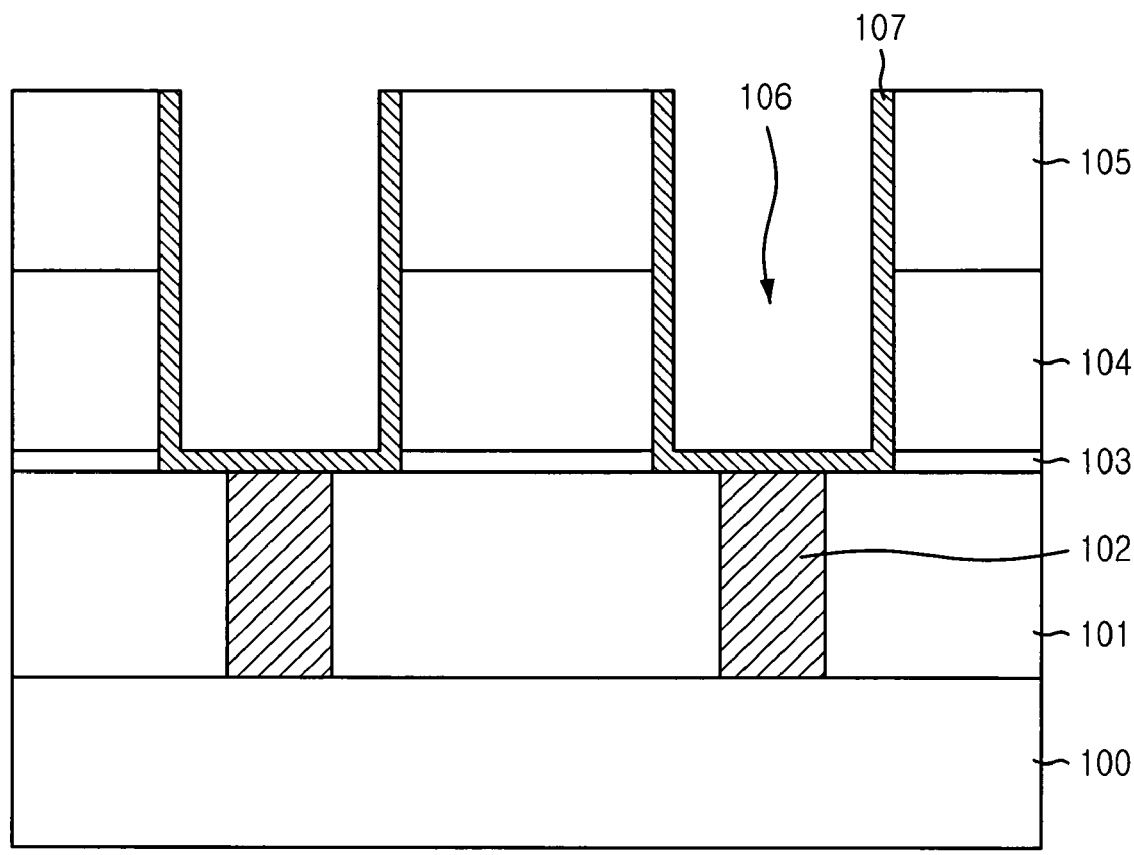
FIG. 1 is a cross-sectional view of a conventional semiconductor device having storage nodes.
Figure 2:
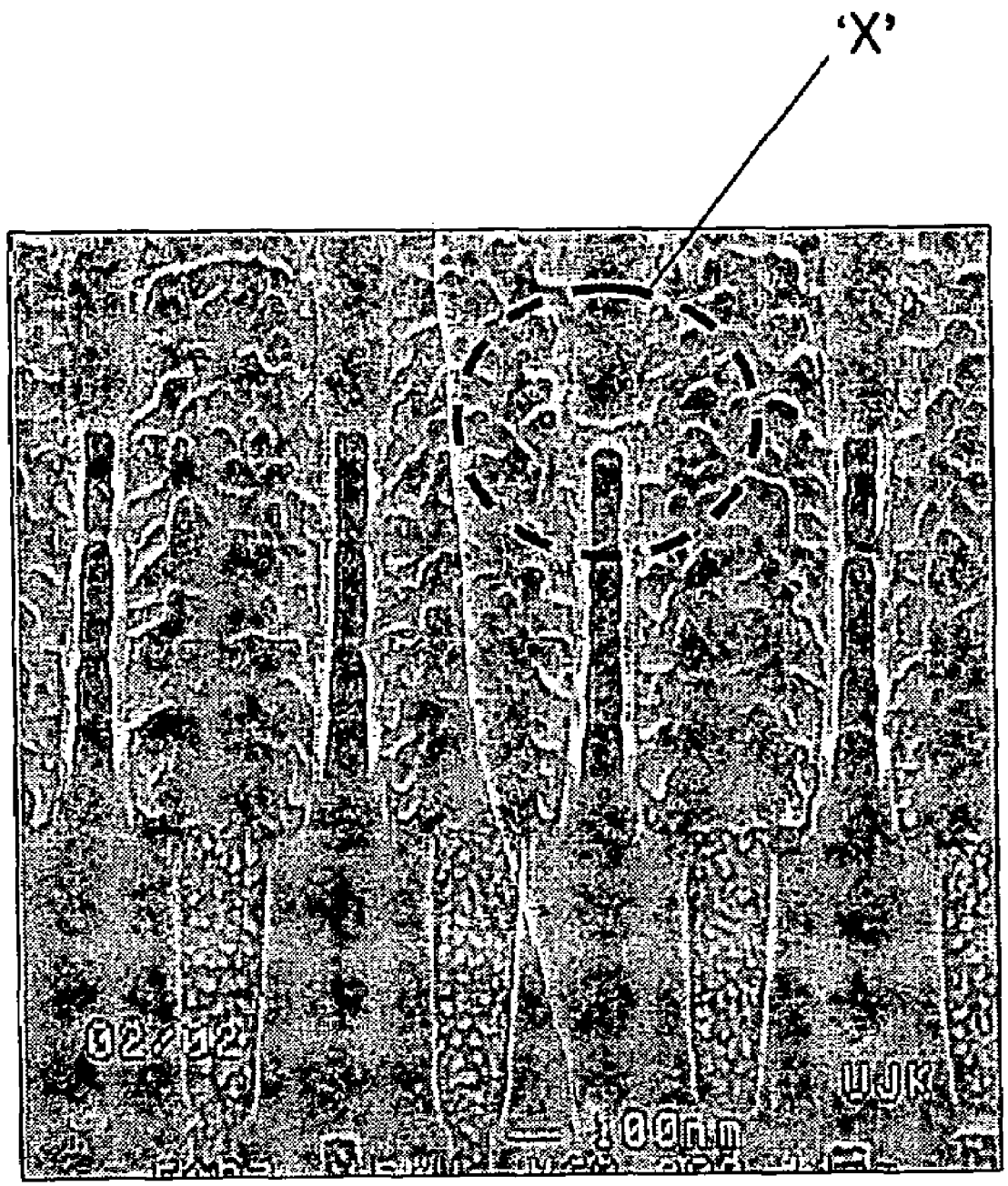
FIG. 2 is a micrograph showing a bridge formed between storage nodes.
Figure 3:
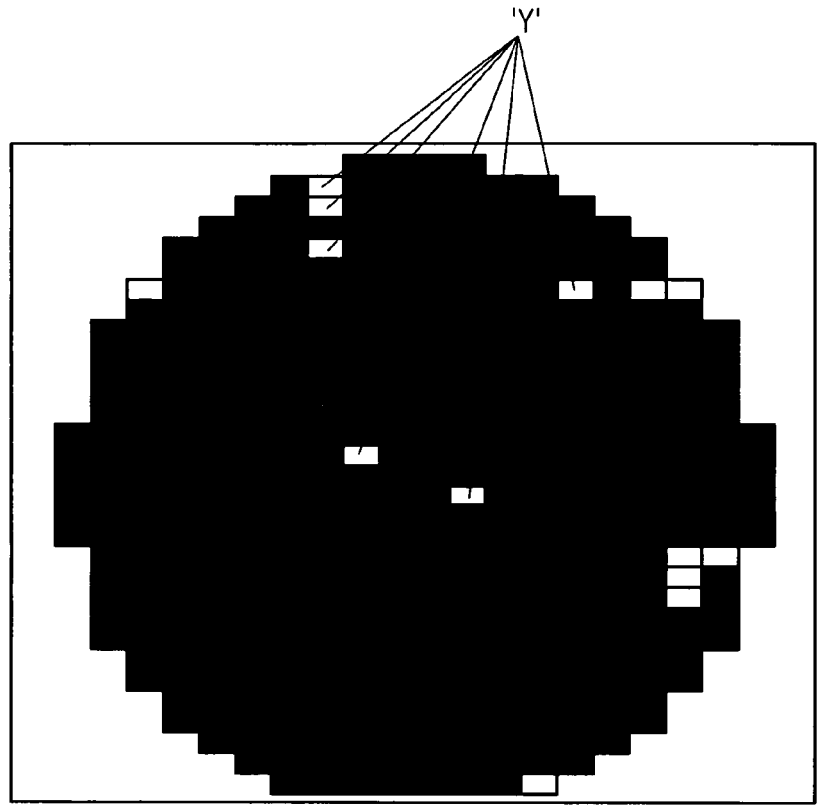
FIG. 3 is a top view showing a bitmap of a conventional wafer indicating pass/fail determination results for a wafer test.

A method for fabricating a semiconductor device in accordance with preferred embodiments of the present invention will be described in detail with reference to the accompanying drawings, which is set forth hereinafter.

FIG. 6 is a flowchart for showing sequential steps of a method for fabricating a semiconductor device in accordance with a first embodiment of the present invention.

As shown in the flowchart, at step S601, a phosphosilicate glass (PSG) layer is formed on a substrate provided with various device elements. Herein, the substrate includes conductive regions which can be gate electrodes, bit lines, metal wires, contact plugs, and contact pads.

At step S602, a capping layer for preventing an incidence of phosphorus diffusion from the PSG layer to a subsequent tetraethylorthosilicate (TEOS) layer caused by a difference in a phosphorus concentration gradient between the PSG layer and the TEOS layer. At this time, a thickness of the capping layer is approximately $1/19$ to approximately $1/5$ of that of the PSG layer. That is, the capping layer has a thickness ranging from approximately 100 Å to approximately 500 Å. Also, the capping layer is made of a material selected from a group consisting of borophosphosilicate glass (BPSG), undoped silicate glass (USG) and PSG containing phosphorus having a concentration in volume percent ranging from approximately 1% by volume to approximately 11% by volume.

At step S603, the above mentioned TEOS layer is formed on the capping layer by employing a plasma enhanced chemical vapor deposition (PECVD) method.

Herein, the capping layer formed between the PSG layer and the TEOS layer serves a role in buffering a phosphorus concentration gradient between the PSG layer and the TEOS layer. Therefore, it is possible to prevent phosphorus from diffusing out from the PSG layer to the TEOS layer.

At step S604, the TEOS layer, the capping layer and the PSG layer are selectively etched to form openings exposing predetermined regions of the substrate, e.g., the conductive regions.

At step S605, a cleaning process for removing etch remnants generated during the opening formation process and an interfacial oxide layer formed at each bottom surface of the openings is carried out. At this time, since the phosphorus diffusion proceeding from the PSG layer to the TEOS layer can be impeded, densities of the PSG layer and an interface between the PSG layer and the TEOS layer do not decrease. Therefore, it is possible to prevent the PSG layer and the TEOS layer from being damaged during a wet cleaning process. For the wet cleaning process, such a cleaning solution as hydrogen fluoride (HF) or buffered oxide etchant (BOE) is used.

At step S606, a conductive layer is formed on the openings, thereby being contacted to the exposed predetermined portions of the substrate.

At step S607, a passivation layer is filled into the openings, and then, a blanket etch-back process or a chemical mechanical polishing (CMP) process is performed to obtain an isolated conductive layer for each opening.

Figure 7A:
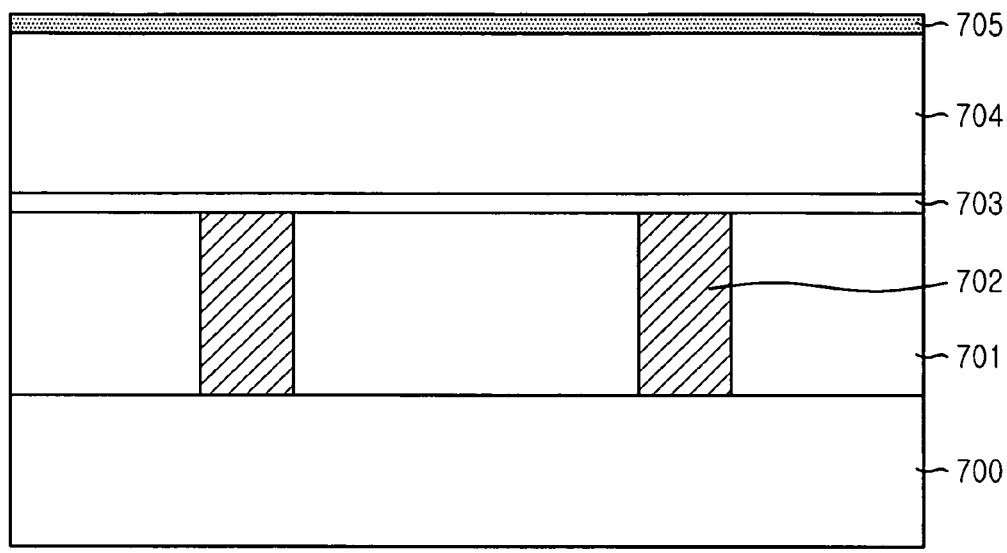
FIGS. 7A to 7C are cross-sectional views illustrating a method for forming storage nodes which are one exemplary application of isolated conductive layer in accordance with the first embodiment.
Figure 7B:
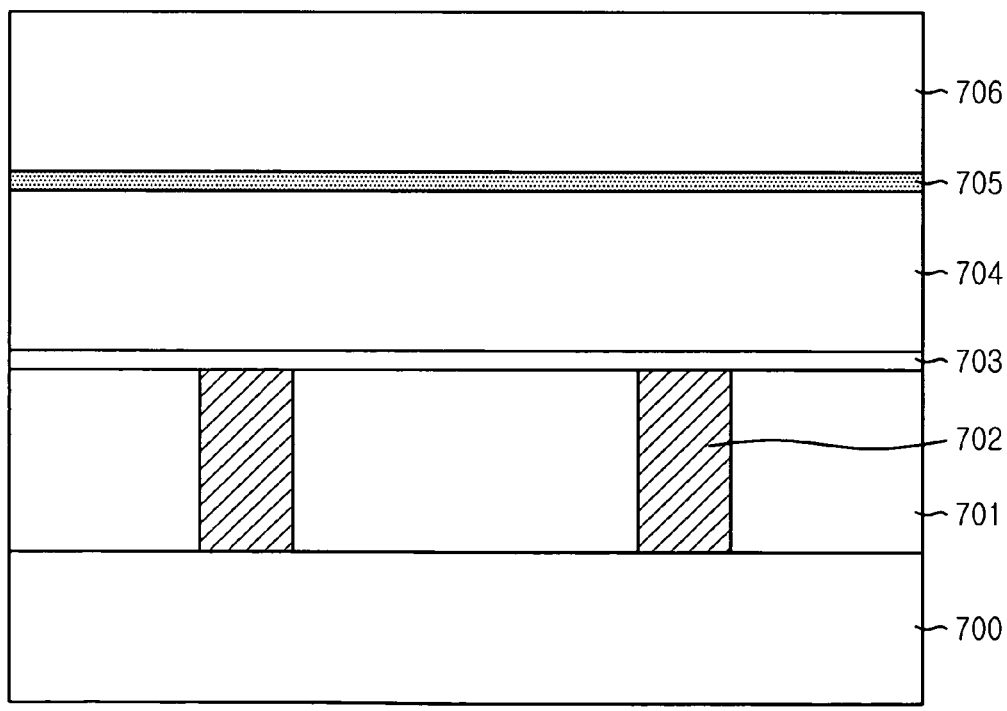
Figure 7C:
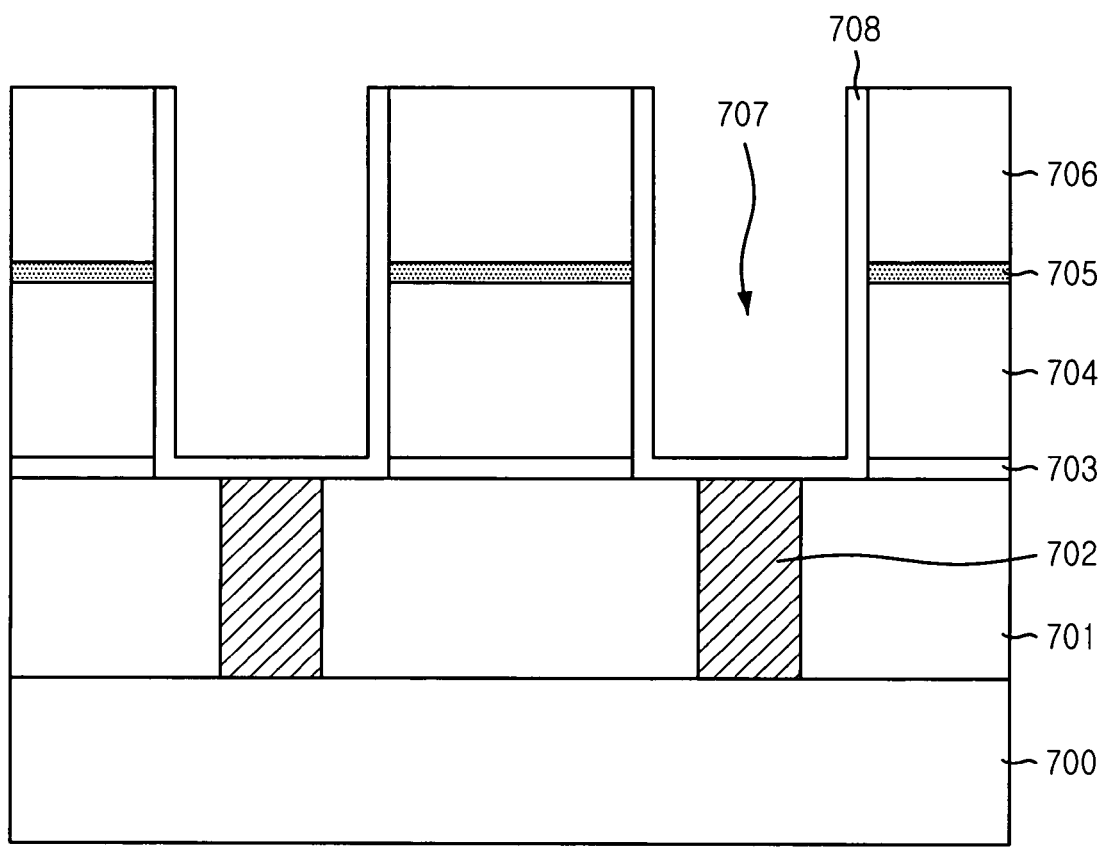

FIGS. 7A to 7C are cross-sectional views illustrating a method for forming storage nodes which are one exemplary application of the above described isolated conductive layer in accordance with the first embodiment.

Although the first embodiment of the present invention exemplifies the case of forming the openings for forming concave or cylindrical capacitors, it is still possible to apply this opening formation process for forming various types of contact holes for forming storage nodes, cell contact plugs, bit lines, and so on. Also, a pattern used for forming such contact holes can have various types such as T-shaped type, an I-shaped type and a hole type.

Referring to FIG. 7A, an inter-layer insulation layer 701 is formed on a substrate 700 provided with various device elements such as wells and transistors. If the inter-layer insulation layer 701 is made of an oxide-based material, such materials as borosilicate glass (BSG), borophosphosilicate glass (BPSG), PSG, TEOS, high density plasma (HDP) oxide, spin on glass (SOG), and advanced planarization layer (APL) can be used. It is also possible to use inorganic or organic based materials having low dielectric characteristics. It should be noted that gate structures and cell contact plugs are not shown in this drawing.

Afterwards, the inter-layer insulation layer 701 is selectively etched to form contact holes exposing the cell contact plugs. A conductive material is formed on the inter-layer insulation layer 701 and is subsequently subjected to a planarization process such as a blanket etch-back process or a CMP process. From this planarization process, a plurality of planarized and isolated storage node contact plugs 702 are formed. Herein, the storage node contact plugs 702 can be made of polysilicon, or of polysilicon combined with a material selected from a group consisting of titanium (Ti), titanium nitride (TiN), tantalum (Ta), and tantalum nitride (TaN).

Next, an etch stop layer 703 is formed on the storage node contact plugs 702 for the purpose of preventing the storage node contact plugs 702 from being damaged during an opening formation process that defines storage nodes of capacitors. The etch stop layer 703 is made of a nitride-based material having an insulation property, for instance, silicon nitride or silicon oxynitride.

Figure 4:
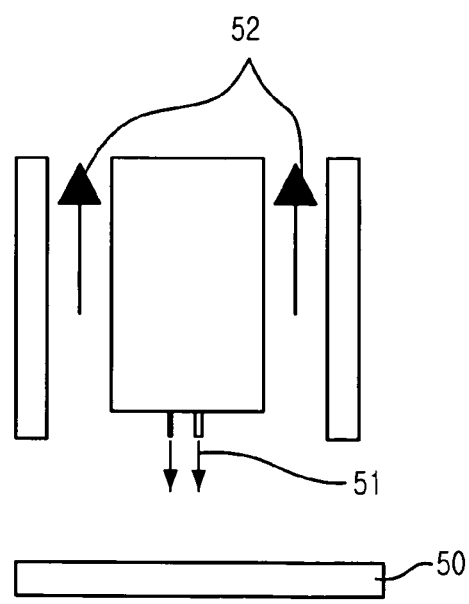
FIG. 4 is a diagram briefly showing a conventional injector used for depositing a phosphosilicate glass (PSG) layer.
Figure 5A:
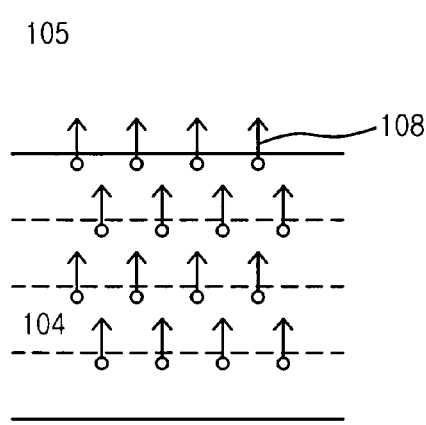
FIGS. 5A to 5D are mimetic diagrams illustrating mechanisms of a bridge formation caused by diffusion of phosphorus contained in a PSG layer.
Figure 5B:
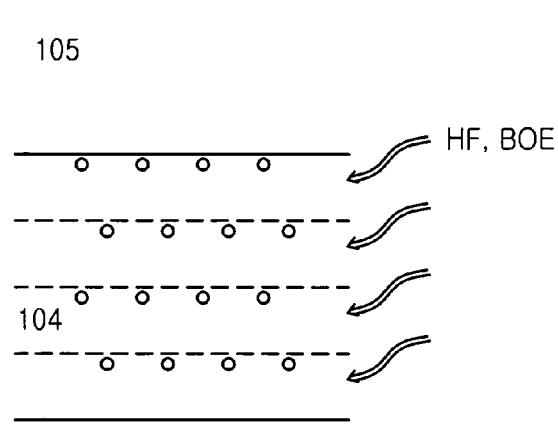
Figure 5C:
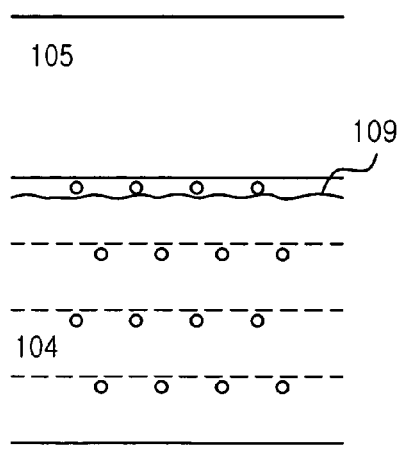
Figure 5D:
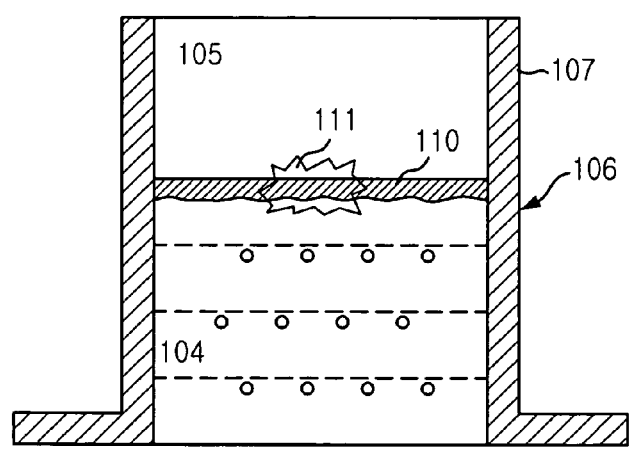

Subsequently, a PSG layer 704 is formed on the etch stop layer 703. At this time, the PSG layer 704 can be formed by employing a deposition device like the injector shown in FIG. 4. In case of injecting a silicon source gas, approximately 150 cc to approximately 250 cc of nitrogen ($N_2$) is used. In case of injecting a phosphorus source gas, approximately 5 cc to approximately 15 cc of $N_2$ is used. Also, a total amount of a reaction gas is in a range from approximately 30 sccm to approximately 45 sccm. The PSG layer 704 is formed under the atmospheric pressure of approximately 760 mTorr, and an automatic wafer conveyer belt moves in a speed ranging from approximately 5 inches per minute to 8 inches per minute. Also, the PSG layer 704 can be formed through one pass or a plurality of passes.

Next, a capping layer 705 for preventing an incidence of phosphorus diffusion caused by a difference in a phosphorus concentration between the PSG layer 704 and a subsequent TEOS layer is formed on the PSG layer 704. At this time, a thickness of the capping layer 705 is approximately 1/19 to approximately 1/9 of that of the PSG layer 704. That is, the thickness of the capping layer 705 preferably ranges from approximately 100 Å to approximately 500 Å. Also, the capping layer 705 is made of a material selected from a group consisting of BPSG, USG and PSG containing phosphorus having a concentration in volume percent ranging from approximately 1% by volume to approximately 11% by volume, or having a concentration in percent by weight of which value is less than approximately 7.5% by weight. The capping layer 705 is formed preferably at a temperature maintained in a range from approximately 490° C. to approximately 560° C.

Meanwhile, in case of employing the deposition device having four injectors, the PSG layer 704 is formed by using the three injectors, and the last one injector can be used for forming the capping layer 705. In this case, the PSG layer 704 and the capping layer 705 are formed through one pass.

In consideration of the phosphorus diffusion caused by a difference in a phosphorus concentration between unit layers comprising the PSG layer 704, the PSG layer 704 is formed by using the three injectors, and the capping layer 705 is formed with use of the last injector through repeating the number of passes. It is also possible to repeat the step of forming the PSG layer 704 by using one injector and forming the capping layer 705 by using another injector.

As described above, the phosphorus diffusion within the PSG layer 704 does not have a great impact on a change in the density of the PSG layer 704. Thus, the capping layer 705 is formed preferably on the PSG layer 704.

Referring to FIG. 7B, a TEOS layer 706 is formed by employing a PECVD method. Herein, the stack structure of the PSG layer 704 and the TEOS layer 706 serves as a capacitor oxide layer. Hence, a total thickness of the PSG layer 704 and the TEOS layer 706 is approximately 25,000 Å. In this case, the PSG layer 704 has a thickness of approximately 7,000 Å, while the TEOS layer 706 has a thickness of approximately 18,000 Å.

Therefore, the capping layer 705 functions as a diffusion barrier layer for buffering a phosphorus concentration gradient between the PSG layer 704 and the TEOS layer 706 or preventing the phosphorus diffusion. That is, the capping layer 705 prevents phosphorus from diffusing out from the PSG layer 704 to the TEOS layer 706. As a result, it is further possible to prevent a decrease in the density of the PSG layer 704 and that of an interface between the PSG layer 704 and the TEOS layer 706.

Referring to FIG. 7C, the TEOS layer 706, the capping layer 705 and the PSG layer 704 are selectively etched to form a plurality of openings 707 exposing the etch stop layer 703 disposed on the storage node contact plugs 702. Herein, the openings 707 are regions where capacitors will be formed.

In case of a typical dynamic random access memory (DRAM) process, etch profiles of the opening 707 are aligned in lateral sides of bit lines (not shown). Also, since the target etch thickness of the above three layers is high, a self-aligned contact (SAC) etching process is employed to secure margins for the above etching process.

The etch stop layer 703 disposed on the storage node contact plugs 702 is removed, thereby exposing the storage node contact plugs 702. Then, a wet cleaning process for removing etch remnants generated during the opening formation process and an interfacial oxide layer formed at each bottom surface of the openings 707 is performed. Herein, the wet cleaning process uses such a cleaning solution as HF or BOE.

Meanwhile, as described above, since the phosphorus diffusion proceeding from the PSG layer 704 to the TEOS layer 706 can be impeded by the capping layer 705, the densities of the PSG layer 704 and the interface between the PSG layer 704 and the TEOS layer 706 are not decreased. As a result, it is possible to prevent the stack structure of the PSG layer 704 and the TEOS layer 706 from being damaged during the wet cleaning process.

Next, a conductive layer is formed on the openings 707 to make an electric connection with the storage node contact plugs 702. Although not illustrated, a passivation layer is filled into the openings 707. Then, a blanket etch-back process or a CMP process is performed under the target of exposing the TEOS layer 706, thereby forming isolated storage nodes 708. Herein, the conductive layer for forming the storage nodes 708 is made of polysilicon, or of polysilicon combined with a material selected from a group consisting of Ti, TiN, Ta, and TaN.

FIG. 8 is a flowchart showing sequential steps of a method for fabricating a semiconductor device in accordance with a second embodiment of the present invention.

At step S801, a PSG layer is formed on a substrate provided with various device elements. Herein, the substrate includes conductive regions which can be gate electrodes, bit lines, metal wires, contact plugs, and contact pads.

At step S802, a surface of the PSG layer is scrubbed in order to make the PSG layer exhibiting hydrophobicity when a subsequent process is delayed by more than a predetermined period, e.g., approximately 5 hours, hydrophilic. The scrubbing proceeds by employing a rinsing process with use of pure water for approximately 40 seconds to approximately 80 seconds. It is also possible to perform the rinsing process in vibration by using pure water for approximately 10 seconds to approximately 30 seconds.

Meanwhile, since the PSG layer is doped with a high concentration of phosphorus, the surface of the PSG layer is unstable compared with a typical impurity undoped oxide layer. Thus, after the PSG layer formation, a subsequent process is delayed. In case that the subsequent process is delayed by more than 5 hours, the surface of the PSG layer changes its property from hydrophilicity to hydrophobicity, which causes adhesiveness of an interface between the PSG layer and a subsequent TEOS layer to be degraded. The hydrophobicity and hydrophilicity of the PSG layer is determined by dropping water on the surface of the PSG layer and then estimating an angle that water makes with the surface of the PSG layer. As the angle is smaller, the surface of the PSG layer is more hydrophilic. On the contrary, as the angle is larger, the surface of the PSG layer is more hydrophobic.

At step S803, a TEOS layer is formed on the scrubbed PSG layer by employing a PECVD method. At this time, since the surface of the PSG layer is hydrophilic, the adhesiveness of an interface between the PSG layer and the TEOS layer is improved.

At step S804, the TEOS layer and the PSG layer are selectively etched to form openings exposing predetermined regions of the substrate, e.g., the conductive regions.

At step S805, a wet cleaning process is performed to remove etch remnants generated during the opening formation process and an interfacial oxide layer formed at each bottom surface of the openings. Herein, the wet cleaning process uses such a cleaning solution as HF or BOE. Since the adhesiveness between the PSG layer and the TEOS layer is improved, it is possible to prevent the interface between the PSG layer and the TEOS layer from being damaged during the wet cleaning process.

At step S806, a conductive layer is formed on the openings to make an electric connection with the predetermined regions of the substrate exposed during the opening formation process.

At step S807, a passivation layer is filled into the openings, and then, a blanket etch-back process or a CMP process is performed under the target of exposing the TEOS layer, thereby isolating the conductive layer for each opening.

Figure 9:
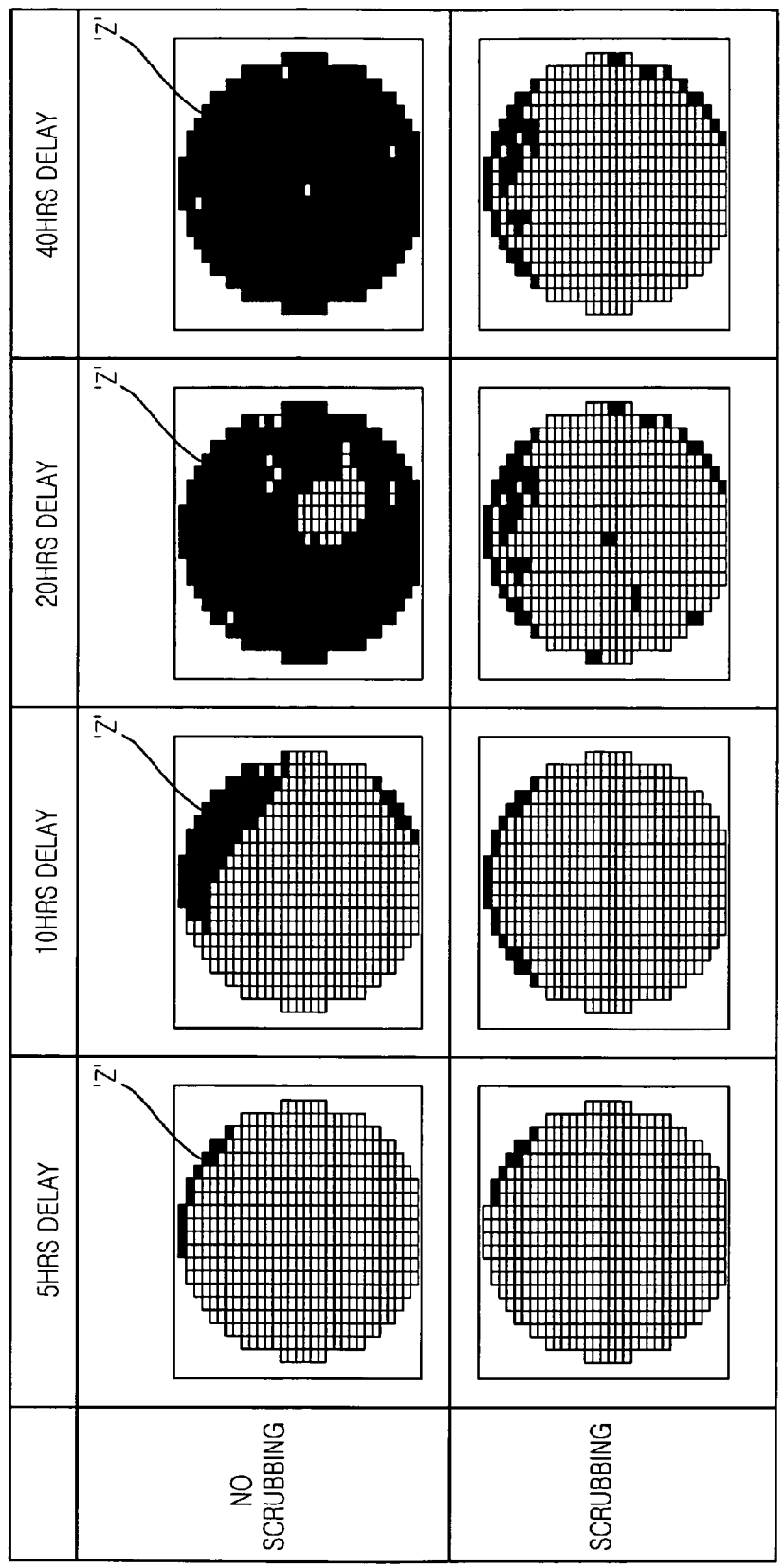
FIG. 9 is a diagram for comparing a frequency of defect generation in a wafer caused by a predetermined time delay after formation of a PSG layer with a decreased frequency of defect generation in a wafer when a scrubbing process is applied to a PSG layer.

FIG. 9 is a diagram for comparing a frequency of defect generation in a wafer caused by a predetermined time delay after formation of a PSG layer with a decreased frequency of defect generation in a wafer when a scrubbing process is applied to a PSG layer.

Especially, after 5 hours later from the PSG layer deposition, when the scrubbing process is not applied, there are several failures in the wafer as expressed with a reference denotation 'Z'. However, there is almost no failure in the wafer when the PSG layer is treated with the scrubbing process. In this case, it is shown experimentally that yields of semiconductor device increase from approximately 84% to approximately 85.3%.

After 10 hours later from the PSG layer deposition, when the PSG layer is not subjected to the scrubbing process, there are several failures Z in the wafer. On the contrary, there is nearly no failure in the wafer when the PSG layer is treated with the scrubbing process. In this case, it is shown experimentally that yields of semiconductor devices increase from approximately 69% to approximately 87%.

After 20 hours later from the PSG layer deposition, there are lots of failures Z in the wafer without applying the scrubbing process. However, the PSG layer subjected to the scrubbing process exhibits the reduced number of failures. In this case, it is shown experimentally that yields of semiconductor devices increase from approximately 7.5% to approximately 82%.

After 50 hours later from the PSG layer deposition, as shown, defects Z are observed almost in the whole area of the wafer that is not treated with the scrubbing process. However, after the PSG layer is subjected to the scrubbing process, the defects Z are shown in a portion of the wafer. In this case, it is shown experimentally that yields of semiconductor devices increase from approximately 0% to approximately 88%.

Figure 10A:
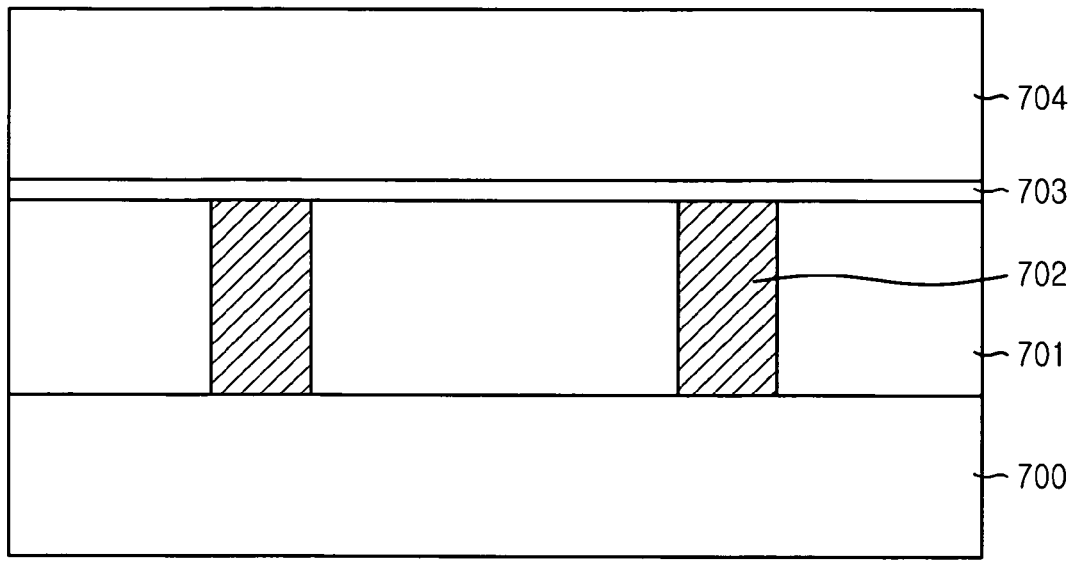
FIGS. 10A and 10E are cross-sectional views illustrating a method for forming storage nodes which are one exemplary application of isolated conductive layer in accordance with the second embodiment.
Figure 10B:
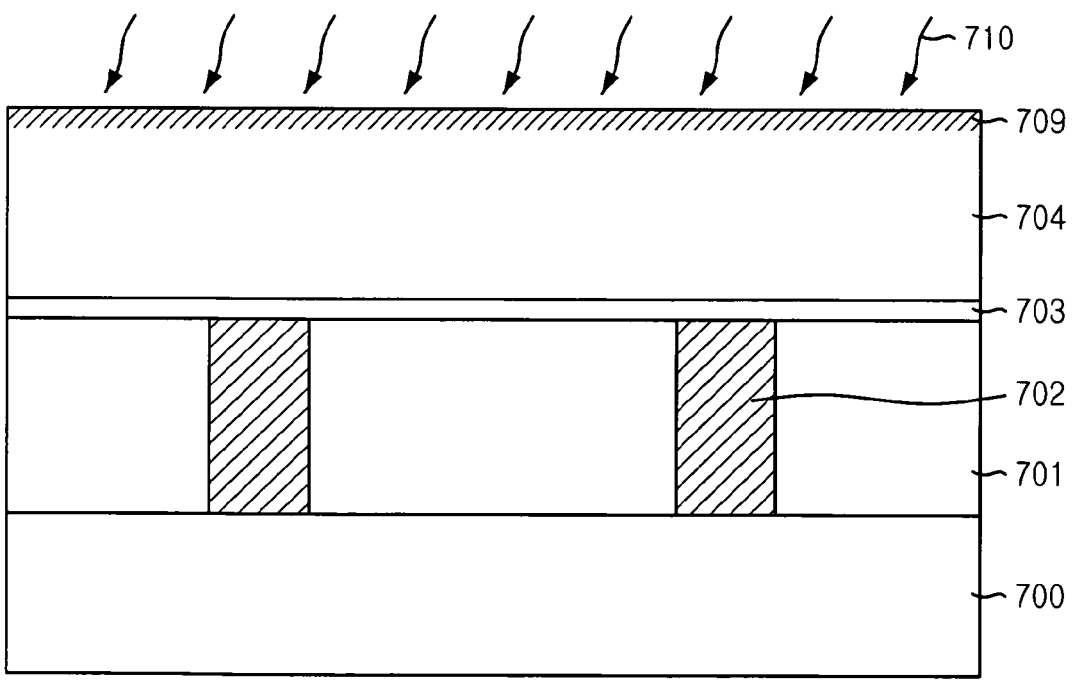
Figure 10C:
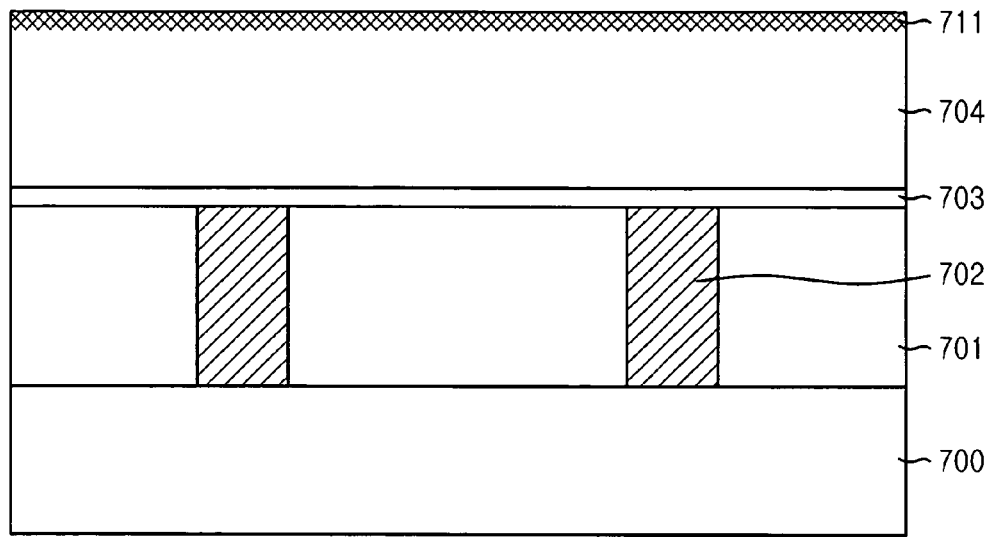
Figure 10D:
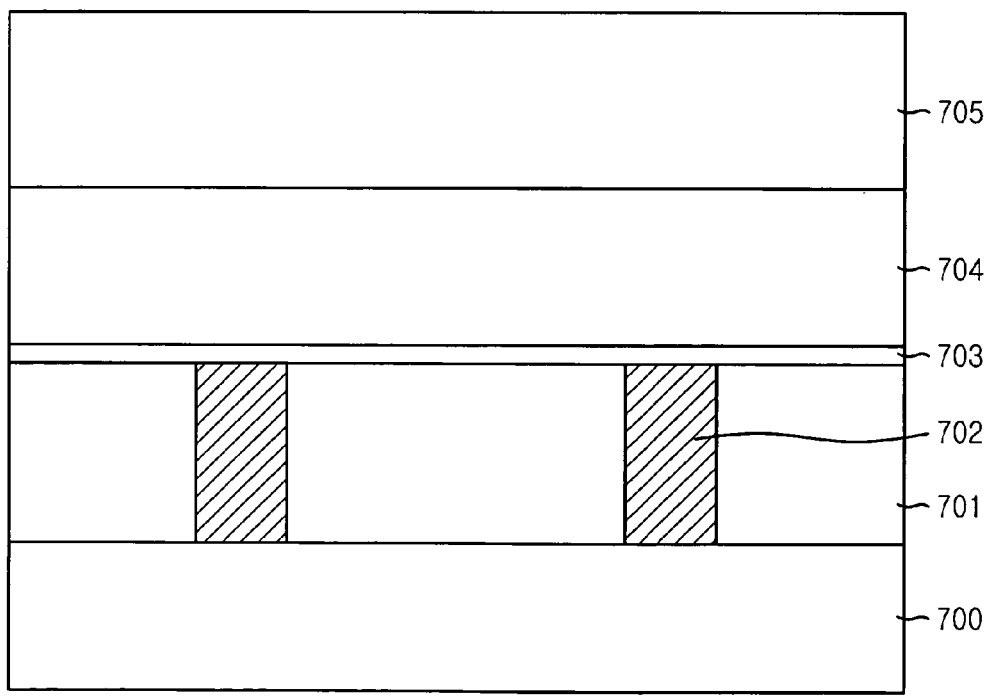
Figure 10E:
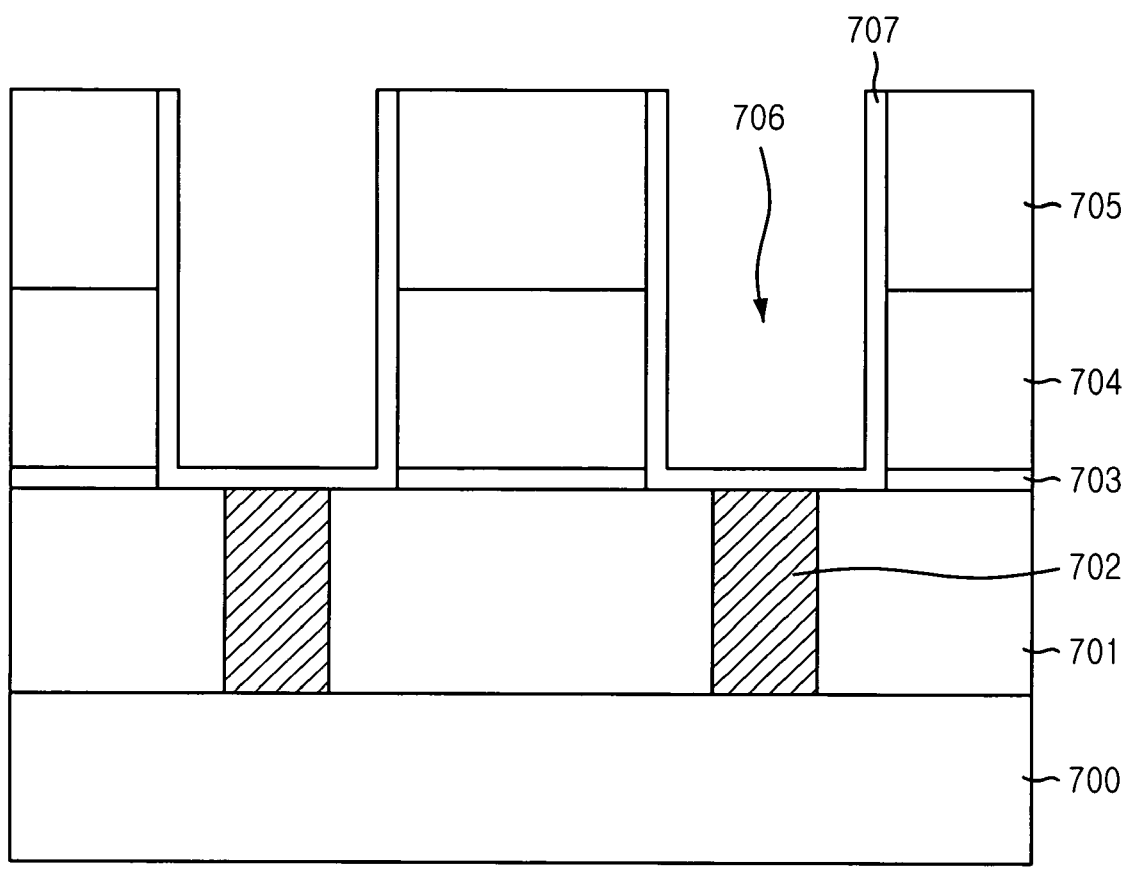

FIGS. 10A and 10E are cross-sectional views illustrating a method for forming storage nodes which are one exemplary application of the above described isolated conductive layer in accordance with the second embodiment. Herein, the same reference numerals described in the first embodiment will be used for the same configuration elements in this drawing.

Referring to FIG. 10A, an inter-layer insulation layer 701 is formed on a substrate 700 provided with various device elements such as wells and transistors. If the inter-layer insulation layer 701 is made of an oxide-based material, such a material selected from a group consisting of BSG, BPSG, PSG, TEOS, HDP oxide, SOG, and APL is used. It is also possible to use inorganic or organic based materials having low dielectric characteristics. It should be noted that gate structures and cell contact plugs are not shown in this drawing.

Afterwards, the inter-layer insulation layer 701 is selectively etched to form contact holes exposing the cell contact plugs. A conductive material is formed on the inter-layer insulation layer 701 and is subsequently subjected to a planarization process such as a blanket etch-back process or a CMP process. From this planarization process, a plurality of planarized and isolated storage node contact plugs 702 are formed. Herein, the storage node contact plugs 702 can be made of polysilicon, or of polysilicon combined with a material selected from a group consisting of Ti, TiN, Ta, and TaN.

Next, an etch stop layer 703 is formed on the storage node contact plugs 702 for the purpose of preventing the storage node contact plugs 702 from being damaged during an opening formation process that defines storage nodes of capacitors. The etch stop layer 703 is made of a nitride-based material having an insulation property, for instance, silicon nitride or silicon oxynitride.

Subsequently, a PSG layer 704 is formed on the etch stop layer 703. At this time, the PSG layer 704 can be formed by employing a deposition device like the injector shown in FIG. 4. In case of injecting a silicon source gas, approximately 150 cc to approximately 250 cc of nitrogen ($N_2$) is used. In case of injecting a phosphorus source gas, approximately 5 cc to approximately 15 cc of $N_2$ is used. Also, a total amount of a reaction gas is in a range from approximately 30 sccm to approximately 45 sccm. The PSG layer 704 is formed under the atmospheric pressure of approximately 760 mTorr, and an automatic wafer conveyer belt moves in a speed ranging from approximately 5 inches per minute to 8 inches per minute. Also, the PSG layer 704 can be formed through one pass or a plurality of passes.

FIG. 10B shows the PSG layer 704 after approximately 5 hours later from the formation of the PSG layer 704. The PSG layer 704 becomes hydrophobic. A reference numeral 709 denotes the hydrophobicity of the PSG layer 704. In order to make a surface of the PSG layer 704 hydrophilic, a scrubbing process 710 is applied to the surface of the PSG layer 704. At this time, the scrubbing process 710 proceeds with a rinsing process with use of pure water for approximately 40 seconds to approximately 80 seconds. Also, the scrubbing process 710 can proceed with the rinsing process performed by giving vibration along with use of pure water for approximately 10 seconds to approximately 30 seconds.

As a result of this scrubbing process, as shown in FIG. 10C, the surface of the PSG layer 704 becomes hydrophilic. A reference numeral 711 denotes the hydrophilicity of the PSG layer 704.

Referring to FIG. 10D, a TEOS layer 705 is formed on the PSG layer 704 by employing a PECVD method. Herein, the stack structure of the PSG layer 704 and the TEOS layer 705 serves as a capacitor oxide layer. Hence, a total thickness of the PSG layer 704 and the TEOS layer 705 is approximately 25,000 Å. In this case, the PSG layer 704 has a thickness of approximately 7,000 Å, while the TEOS layer 705 has a thickness of approximately 18,000 Å.

Referring to FIG. 10E, the TEOS layer 705 and the PSG layer 704 are selectively etched to form a plurality of openings 706 exposing the etch stop layer 703 disposed on the storage node contact plugs 702. Herein, the openings 706 are regions where capacitors will be formed.

In case of a typical DRAM process, etch profiles of the opening 706 are aligned in lateral sides of bit lines (not shown). Also, since the target etch thickness of the above three layers is high, a SAC etching process is employed to secure margins for the above etching process.

The etch stop layer 703 disposed on the storage node contact plugs 702 is removed, thereby exposing the storage node contact plugs .702. Then, a wet cleaning process for removing etch remnants generated during the opening formation process and an interfacial oxide layer formed at each bottom surface of the openings 706 is performed. Herein, the wet cleaning process uses such a cleaning solution as HF or BOE.

Next, a conductive layer is formed on the openings 706 to make an electric connection with the storage node contact plugs 702. Although not illustrated, a passivation layer is filled into the openings 706. Then, a blanket etch-back process or a CMP process is performed under the target of exposing the TEOS layer 705, thereby forming isolated storage nodes 707. Herein, the conductive layer for forming the storage nodes 707 is made of polysilicon, or of polysilicon combined with a material selected from a group consisting of Ti, TiN, Ta, and TaN.

In accordance with the second embodiment of the present invention, adhesiveness between the PSG layer 704 and the TEOS layer 705 is improved by making the hydrophobic surface of the PSG layer 704 hydrophilic through the scrubbing process. As a result, an interface between the PSG layer 704 and the TEOS layer 705 is free from damages occurring during the wet cleaning process for removing etch remnants created during the opening formation process and removing an interfacial oxide layer formed at each bottom surface of the openings.

Figure 11:
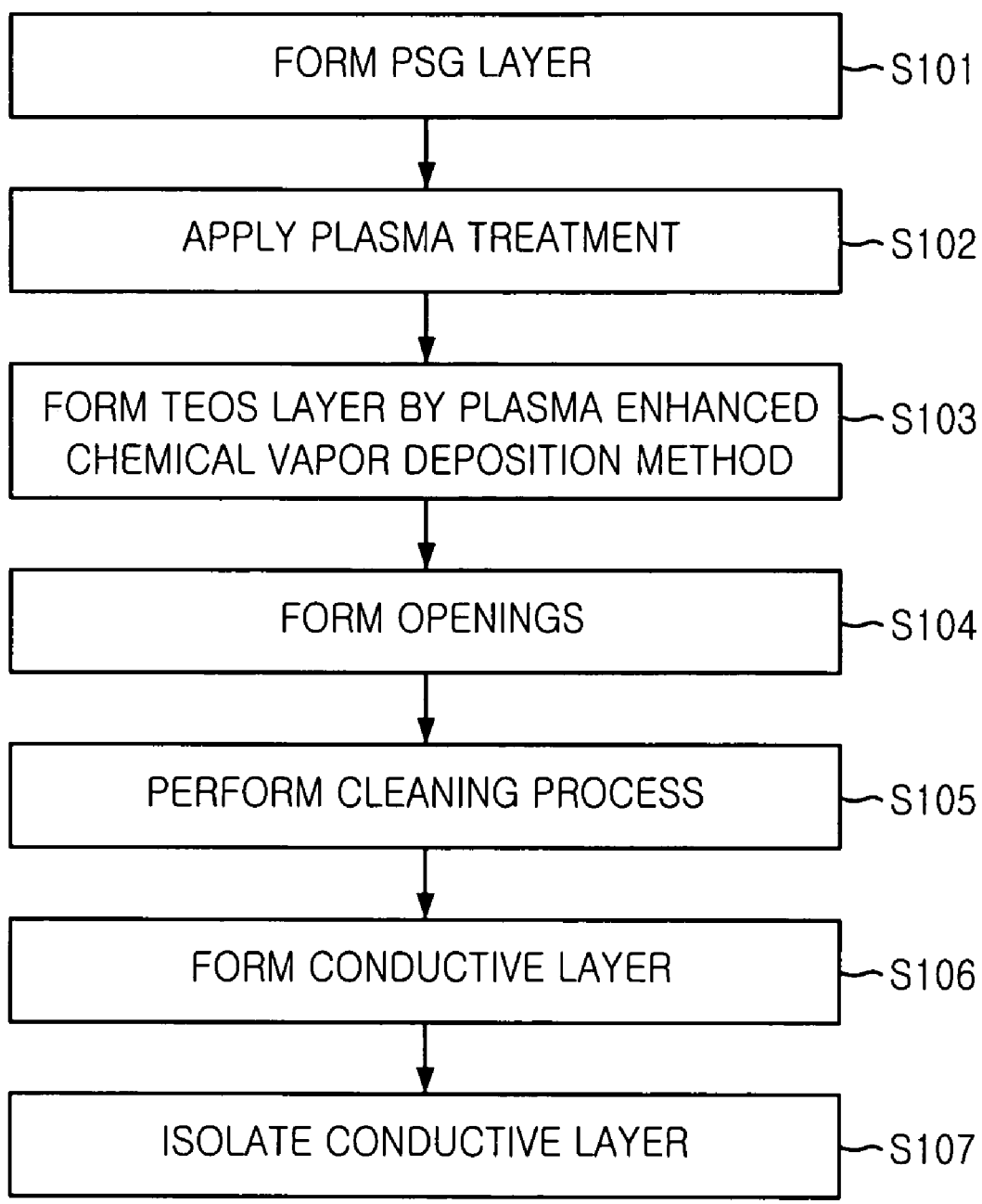
FIG. 11 is a flowchart showing sequential steps of a method for forming a semiconductor device in accordance with a third preferred embodiment of the present invention.

FIG. 11 is a flowchart showing sequential steps of a method for forming a semiconductor device in accordance with a third preferred embodiment of the present invention.

At step S101, a PSG layer is formed on a substrate provided with various device elements. Herein, conductive regions which can be one of gate electrodes, bit lines, metal wires, contact plugs, and contact pads are formed on the substrate.

At step S102, a surface of the PSG layer is then subjected to a plasma treatment in order to prevent deterioration of adhesiveness between the PSG layer and a subsequent TEOS layer caused by the use of different materials for the PSG layer and the TEOS layer. For the plasma treatment, such a gas selected from a group consisting of $N_2$, nitrogen oxide ($N_2O$), hydrogen ($H_2$) and oxygen ($O_2$) is used, and a surface of the PSG layer is stabilized by forming a thin oxide or nitride layer obtained through inducing a combination reaction between the injected gas molecules provided from the plasma treatment and dangling bonds on the surface of the PSG layer.

At step S103, the above mentioned TEOS layer is formed on the PSG layer by employing a PECVD method. At this time, since the surface of the PSG layer is stabilized by the plasma treatment, adhesiveness between the PSG layer and the TEOS layer is improved.

At step S104, the TEOS layer and the PSG layer are selectively etched to form openings exposing predetermined portions of the substrate, e.g., the conductive regions.

At step S105, a wet cleaning process is performed to remove etch remnants generated during the opening formation process and an interfacial oxide layer formed at each bottom surfaces of the openings. At this time, such a cleaning solution as HF or BOE is used in the wet cleaning process.

Meanwhile, since the adhesiveness between the PSG layer and the TEOS layer is improved by the plasma treatment, it is possible to prevent the interface between the PSG layer and the TEOS layer from being damaged during the wet cleaning process.

At step S106, a conductive layer is formed on the openings, thereby electrically connecting the conductive layer to the predetermined regions of the substrate exposed by the opening formation process.

At step S107, a passivation layer is filled into the openings, and then, a blanket etch-back process or a CMP process is performed to isolate the conductive layer for each opening.

FIGS. 12A to 12D are cross-sectional views illustrating a method for forming storage nodes which are one exemplary application of the above described isolated conductive layer in accordance with the third embodiment. Herein, the same reference numerals described in the first embodiment will be used for the same configuration elements in this drawing.

Figure 12A:
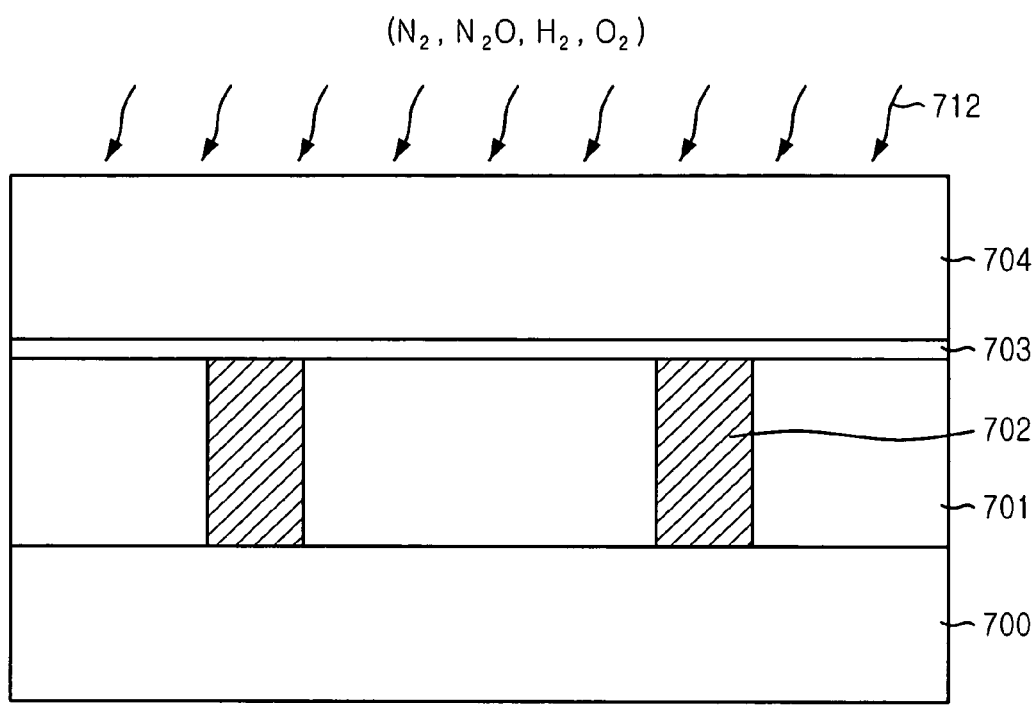
FIGS. 12A to 12D are cross-sectional views illustrating a method for forming storage nodes which are one exemplary application of isolated conductive layer in accordance with the third embodiment.

Referring to FIG. 12A, an inter-layer insulation layer 701 is formed on a substrate 700 provided with various device elements such as wells and transistors. If the inter-layer insulation layer 701 is made of an oxide-based material, such materials as BSG, BPSG, PSG, TEOS, HDP oxide, SOG, and APL can be used. It is also possible to use inorganic or organic based materials having low dielectric characteristics. It should be noted that gate structures and cell contact plugs are not shown in this drawing.

Afterwards, the inter-layer insulation layer 701 is selectively etched to form contact holes exposing the cell contact plugs. A conductive material is formed on the inter-layer insulation layer 701 and is subsequently subjected to a planarization process such as a blanket etch-back process or a CMP process. From this planarization process, a plurality of planarized and isolated storage node contact plugs 702 are formed. Herein, the storage node contact plugs 702 can be made of polysilicon, or of polysilicon combined with a material selected from a group consisting of Ti, TiN, Ta, and TaN.

Next, an etch stop layer 703 is formed on the storage node contact plugs 702 for the purpose of preventing the storage node contact plugs 702 from being damaged during an opening formation process that defines storage nodes of capacitors. The etch stop layer 703 is made of a nitride-based material having an insulation property, for instance, silicon nitride or silicon oxynitride.

Subsequently, a PSG layer 704 is formed on the etch stop layer 703. At this time, the PSG layer 704 can be formed by employing a deposition device like the injector shown in FIG. 4. In case of injecting a silicon source gas, approximately 150 cc to approximately 250 cc of nitrogen ($N_2$) is used. In case of injecting a phosphorus source gas, approximately 5 cc to approximately 15 cc of $N_2$ is used. Also, a total amount of a reaction gas is in a range from approximately 30 sccm to approximately 45 sccm. The PSG layer 704 is formed under the atmospheric pressure of approximately 760 mTorr, and an automatic wafer conveyer belt moves in a speed ranging from approximately 5 inches per minute to 8 inches per minute. Also, the PSG layer 704 can be formed through one pass or a plurality of passes.

Afterwards, the PSG layer 704 is subjected to a plasma treatment 712 in order to stabilize a surface of the PSG layer 704. At this time, such a gas selected from a group consisting of $N_2$, $N_2O$, $H_2$ and $O_2$ is used for the plasma treatment 712, which induces a combination reaction-between this selected gas and dangling bonds on the surface of the PSG layer 704 to form a thin layer on the PSG layer for the purpose of stabilizing the surface of the PSG layer 704.

Figure 12B:
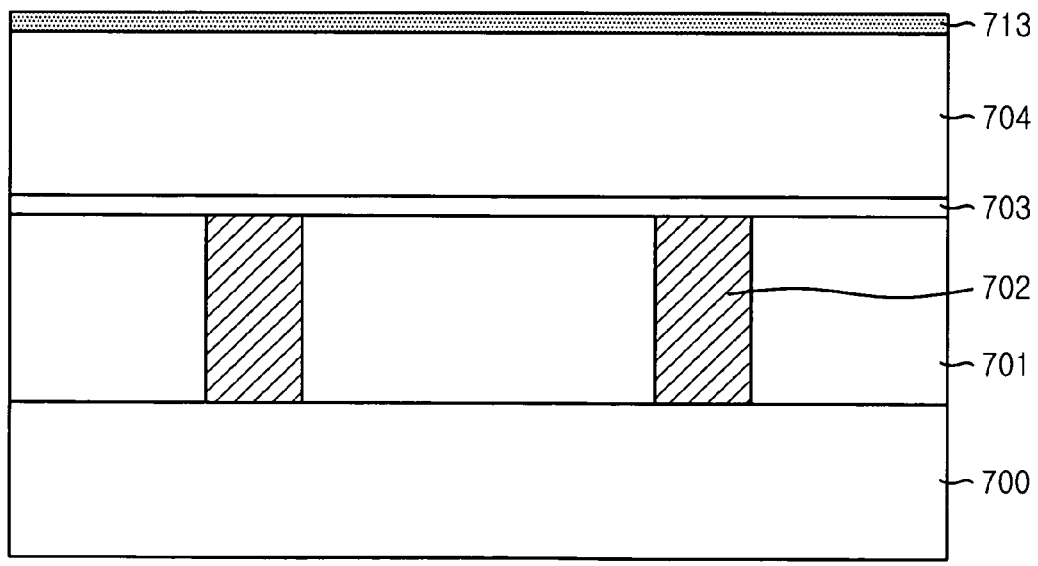

FIG. 12B is a cross-sectional view showing the above mentioned thin layer formed on the PSG layer through the application of the plasma treatment 712 shown in FIG. 12A. This thin layer denoted with a reference numeral 713 is one of an oxide layer and a nitride layer.

Figure 12C:
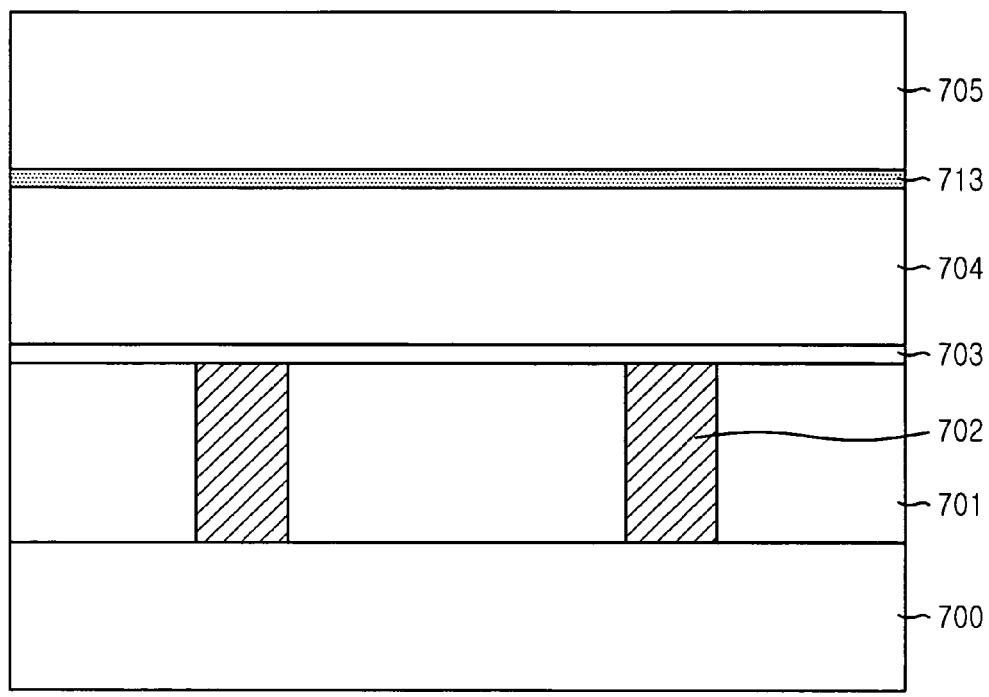

Referring to FIG. 12C, a TEOS layer 705 is formed on the thin layer 713 by employing a PECVD method. Herein, the stack structure of the PSG layer 704 and the TEOS layer 705 serves as a capacitor oxide layer. Hence, a total thickness of the PSG layer 704 and the TEOS layer 705 is approximately 25,000 Å. In this case, the PSG layer 704 has a thickness of approximately 7,000 Å, while the TEOS layer 705 has a thickness of approximately 18,000 Å.

Figure 12D:
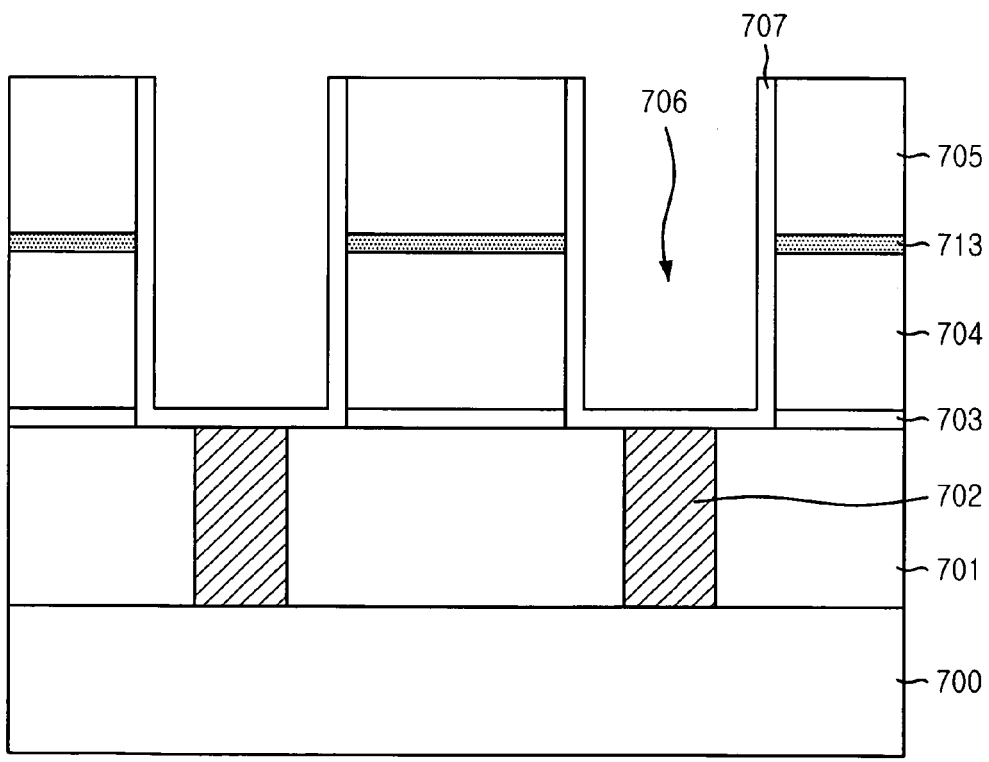

Referring to FIG. 12D, the TEOS layer 705, the thin layer 713 and the PSG layer 704 are selectively etched to form a plurality of openings 706 exposing the etch stop layer 703 disposed on the storage node contact plugs 702. Herein, the openings 706 are regions where capacitors will be formed.

In case of a typical DRAM process, etch profiles of the opening 706 are aligned in lateral sides of bit lines (not shown). Also, since the target etch thickness of the above three layers is high, a SAC etching process is employed to secure margins for the above etching process.

The etch stop layer 703 disposed on the storage node contact plugs 702 is removed, thereby exposing the storage node contact plugs 702. Then, a wet cleaning process for removing etch remnants generated during the opening formation process and an interfacial oxide layer formed at each bottom surface of the openings 706 is performed. Herein, the wet cleaning process uses such a cleaning solution as HF or BOE.

Next, a conductive layer is formed on the openings 706 to make an electric connection with the storage node contact plugs 702. Although not illustrated, a passivation layer is filled into the openings 706. Then, a blanket etch-back process or a CMP process is performed under the target of exposing the TEOS layer 705, thereby forming isolated storage nodes 707. Herein, the conductive layer for forming the storage nodes 707 is made of polysilicon, or of polysilicon combined with a material selected from a group consisting of Ti, TiN, Ta, and TaN.

In accordance with the third embodiment of the present invention, adhesiveness between the PSG layer and the TEOS layer can be improved by forming the TEOS layer on the stabilized PSG layer obtained through the application of the plasma treatment. As a result of this improved adhesiveness, it is possible to prevent damages to the interface between the PSG layer and the TEOS layer during the wet cleaning process for removing the etch remnants and the interfacial oxide layer at each bottom surface of the openings.

In accordance with the first to the third embodiments of the present invention, for the case of the tunnel formation during the wet cleaning process because of a decrease in the density of the PSG layer as phosphorus contained in the PSG layer diffuses from the PSG layer to the TEOS layer and because of a degraded interface characteristic between the PSG layer and the TEOS layer caused by the diffused phosphorus reacting with moisture of the atmosphere, the capping layer is formed on the PSG layer in order to prevent the phosphorus contained in the PSG layer from diffusing. The capping layer particularly prevents the phosphorus diffusion caused by a difference in a phosphorus concentration gradient and as a result, improves the degraded interface characteristic.

Also, for the case of the degraded adhesiveness between the PSG layer and the TEOS layer caused by a change in a surface property of the PSG layer from hydrophilicity to hydrophobicity due to a delay after the PSG layer formation, the scrubbing process with use of the rinsing process is employed to make the surface of the PSG layer hydrophilic, so that the adhesiveness between the PSG layer and the TEOS layer is improved.

Furthermore, for the case of the degraded adhesiveness between the PSG layer and the TEOS layer caused by the use of different types of materials for the PSG layer and the TEOS layer, the plasma treatment is applied to the PSG layer to improve the interface characteristic, thereby increasing the adhesiveness between the PSG layer and the TEOS layer.

Accordingly, it is possible to prevent the capacitor oxide structure including the PSG layer and the TEOS layer from being damaged during the wet cleaning process. As a result of this effect, it is further possible to prevent the bridge formation between the conductive layers isolated by the capacitor oxide structure, i.e., the storage nodes, and thus to improve yields of semiconductor devices.

The present application contains subject matter related to the Korean patent application No. KR 2004-0050189, filed in the Korean Patent Office on Jun. 30, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, comprising the steps of:
    forming a phosphosilicate glass (PSG) layer over a substrate where elements are already formed;
    forming a capping layer on the PSG layer;
    forming a tetraethylorthosilicate (TEOS) layer on the capping layer;
    selectively etching the TEOS layer, the capping layer and the PSG layer to form a plurality of openings exposing predetermined portions of the substrate;
    cleaning the openings;
    forming a conductive layer on the openings; and
    removing the conductive layer until the TEOS layer is exposed, so that the conductive layer is isolated for each opening, wherein the capping layer is formed to prevent phosphorus from diffusing out from the PSG layer to the TEOS layer due to a difference in a phosphorus concentration gradient.

2. The method as recited in claim 1, wherein the capping layer has a thickness that is approximately 1/19 to approximately 1/9 of that of the PSG layer.

3. The method as recited in claim 1, wherein the capping layer has a thickness ranging from approximately 100 Å to approximately 500 Å.

4. The method as recited in claim 2, wherein the capping layer has a thickness ranging from approximately 100 Å to approximately 500 Å.

5. The method as recited in claim 1, wherein the capping layer is made of a material selected from a group consisting of borophosphosilicate glass (BPSG), undoped silicate glass (USG) and PSG containing phosphorus of which concentration ranges from approximately 1% by volume to approximately 11% by volume.

6. The method as recited in claim 1, wherein the capping layer is made of a material selected from a group consisting of BPSG, USG and PSG containing phosphorus of which concentration ranges from approximately 1% by volume to approximately 11% by volume.

7. The method as recited in claim 1, wherein the TEOS layer is formed by employing a plasma enhanced chemical vapor deposition (PECVD) method.

8. The method as recited in claim 1, wherein a plurality of isolated storage node contact plugs is further formed between the substrate and the PSG layer.

9. The method as recited in claim 8, wherein the capping layer has a thickness that is approximately 1/9 to approximately 1/9 of that of the PSG layer.

10. The method as recited in claim 8, wherein the capping layer has a thickness ranging from approximately 100 Å to approximately 500 Å.

11. The method as recited in claim 9, wherein the capping layer has a thickness ranging from approximately 100 Å to approximately 500 Å.

12. The method as recited in claim 8, wherein the capping layer is made of a material selected from a group consisting of BPSG, USG and PSG containing phosphorus of which concentration ranges from approximately 1% by volume to approximately 11% by volume.

13. The method as recited in claim 9, wherein the capping layer is made of a material selected from a group consisting of BPSG, USG and PSG containing phosphorus of which concentration ranges from approximately 1% by volume to approximately 11% by volume.

14. The method as recited in claim 8, wherein the TEOS layer is formed by employing a PECVD method.

* * * * *